(12) United States Patent
Jhan et al.

(10) Patent No.: US 11,217,509 B2
(45) Date of Patent: Jan. 4, 2022

(54) SEMICONDUCTOR PACKAGE STRUCTURE

(71) Applicant: Advanced Semiconductor Engineering, Inc., Kaohsiung (TW)

(72) Inventors: Jyun-Chi Jhan, Kaohsiung (TW); Guo-Cheng Liao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 52 days.

(21) Appl. No.: 16/749,586

(22) Filed: Jan. 22, 2020

(65) Prior Publication Data

US 2021/0225742 A1      Jul. 22, 2021

(51) Int. Cl.
| | |
|---|---|
| *H01L 23/495* | (2006.01) |
| *H01L 23/00* | (2006.01) |
| *H01L 23/31* | (2006.01) |

(52) U.S. Cl.
CPC .... *H01L 23/49548* (2013.01); *H01L 23/3107* (2013.01); *H01L 23/4952* (2013.01); *H01L 23/49503* (2013.01); *H01L 24/48* (2013.01); *H01L 2224/48175* (2013.01)

(58) Field of Classification Search
CPC ........... H01L 23/49548; H01L 23/3107; H01L 23/49503; H01L 23/4952
See application file for complete search history.

(56) References Cited

U.S. PATENT DOCUMENTS

| | | | | |
|---|---|---|---|---|
| 6,087,712 A | * | 7/2000 | Kim | H01L 23/49582 257/666 |
| 6,677,662 B1 | * | 1/2004 | Chung | H01L 23/34 257/666 |
| 6,927,483 B1 | * | 8/2005 | Lee | H01L 23/3107 257/666 |
| 8,796,830 B1 | * | 8/2014 | Fjelstad | H01L 25/105 257/676 |
| 9,275,939 B1 | * | 3/2016 | Bae | H01L 23/4952 |
| 2014/0327122 A1 | * | 11/2014 | Jeon | H01L 23/49541 257/670 |
| 2015/0185895 A1 | * | 7/2015 | Vreman | H01L 31/125 349/12 |

FOREIGN PATENT DOCUMENTS

JP      6573157 B2      1/2017

OTHER PUBLICATIONS

U.S. Appl. No. 16/442,286, filed Jun. 14, 2019, Chen et al.
U.S. Appl. No. 16/693,193, filed Nov. 22, 2019, Hsu et al.

* cited by examiner

*Primary Examiner* — Marc Anthony Armand
(74) *Attorney, Agent, or Firm* — Foley & Lardner LLP (57) ABSTRACT

Present disclosure provides a lead frame, including a die paddle and a plurality of leads surrounding the die paddle. Each of the leads including a finger portion proximal to the die paddle and a lead portion distal from the die paddle. The finger portion includes a main body and at least one support structure. The respective support structures on adjacent leads are mutually isolated, and a distance between the support structure and the die paddle is smaller than a distance between the lead portion and the die paddle. A semiconductor package structure including the lead frame described herein and a semiconductor package assembly including the semiconductor package structure described herein are also provided.

5 Claims, 11 Drawing Sheets

SEMICONDUCTOR PACKAGE STRUCTURE

TECHNICAL FIELD

The present disclosure relates to a semiconductor package structure including a lead frame.

DESCRIPTION OF THE RELATED ART

Lead frame includes a die paddle and a plurality of leads extending toward the die paddle. A semiconductor die disposed on the die paddle is electrically connected to each of the leads through a bonding wire. With the trend of ever-increasing I/O density on the semiconductor die, bonding wires connecting each of the I/Os and each of the leads are formed in a denser arrangement which is prone to crossing each other or short.

The longer the length of the bonding wire, the more serious the bonding wire crossing and/or short. To shorten the length of the bonding wire, each of the leads of the lead frame is modified to be longer, or to be closer to the die paddle. However, when the length of a finger portion of the individual lead is greater than 2 millimeter, a terminal end of the lead proximal to the die paddle sags and causing such terminal end to expose from an the molding compound after the encapsulation operation of the lead frame. In addition, bonding wires connecting the I/Os of the semiconductor die and such terminal end is dragged and deformed due to the sagging, causing failure to the signal lines.

SUMMARY

In some embodiments, present disclosure provides a lead frame, including a die paddle and a plurality of leads surrounding the die paddle. Each of the leads including a finger portion proximal to the die paddle and a lead portion distal from the die paddle. The finger portion includes a main body and at least one support structure. The respective support structures on adjacent leads are mutually isolated, and a distance between the support structure and the die paddle is smaller than a distance between the lead portion and the die paddle.

In some embodiments, present disclosure provides a semiconductor package structure, including a die paddle and a plurality of leads surrounding the die paddle. Each of the leads includes a terminal end proximal to the die paddle and a lead end distal from the die paddle. Each of the leads includes a main body and at least one support structure. A distance between the support structure and the terminal end is smaller than a distance between the support structure and the lead end.

In some embodiments, present disclosure provides a semiconductor package assembly, including a die paddle, a plurality of leads surrounding the die paddle, and a substrate under the die paddle and the plurality of leads. Each of the leads includes a finger portion proximal to the die paddle and a lead portion distal from the die paddle. The finger portion includes a main body and at least one support structure. The support structure is a dummy structure with respect to the substrate. The respective support structures on adjacent leads are mutually isolated, and a distance between the support structure and the die paddle is smaller than a distance between the lead portion and the die paddle.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As discussed previously in the background section, to shorten the length of the bonding wire, another approach to shorten the length of the finger portion of the lead is to increase the length ratio of the lead portion of the lead and the finger portion of the lead. Compared to the finger portion of the lead, where the metal is half-etched along a thickness direction, the lead portion of the lead contain a section of metal having a full thickness. Signals transmitting through a higher length ratio of the lead portion can be changed and therefore it is not a versatile solution to various semiconductor die packages. Yet another approach to prevent the sagging of the finger portion of the lead is to replace original material with a higher strength material. However, the extent of mitigation to the sagging is limited.

Present disclosure provides a lead frame having a die paddle and a plurality of leads surrounding the ide paddle. Each of the leads includes a support structure at the finger portion so as to prevent sagging of the lead and the exposure of the end of the lead proximal to the die paddle from the encapsulant. Similar to the lead portion, the support structure can be a metal section with full thickness and spaced away from a side surface of the finger portion facing the die paddle. A semiconductor package structure encapsulating the lead frame discussed herein is provided. A semiconductor package assembly including the semiconductor package structure discussed herein and a substrate, for example, a PCB, is also provided.

Figure 1:
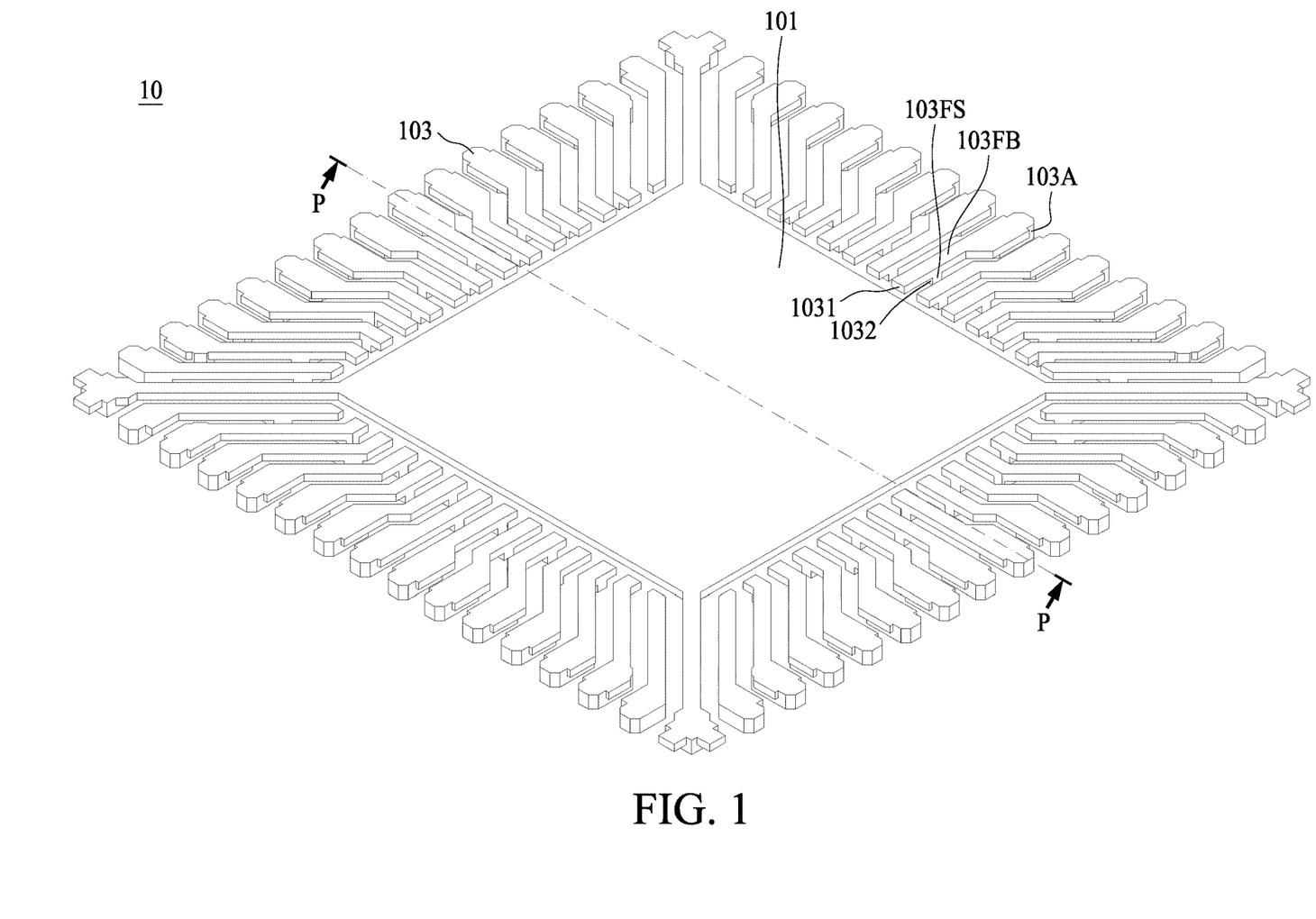
FIG. 1 illustrates a perspective view from a top side of a lead frame according to some embodiments of the present disclosure.

Referring to FIG. 1, FIG. 1 illustrates a perspective view from a top side of a lead frame 10 according to some embodiments of the present disclosure. The lead frame 10 includes a die paddle 101 and a plurality of leads 103 surrounding the die paddle 101. Each of the plurality of the leads includes a lead portion 103A distal from the die paddle 101, a main body 103FB, and a support structure 103FS connected to the main body 103FB. The main body 103FB possesses a side surface 1031 facing the die paddle 101 and spaced apart from the die paddle 101. The support structure 103FS possesses a side surface 1032 facing the die paddle 101 and spaced apart from the die paddle 101. As can be inferred from the perspective view of FIG. 1, the respective support structure 103FS on any adjacent leads 103 are mutually isolated, that is, each of the support structure 103FS is monolithically integrated with the main body 103FB and the lead portion 103A without physical coupling with the support structure 103FS on the immediate adjacent lead 103.

Figure 2:
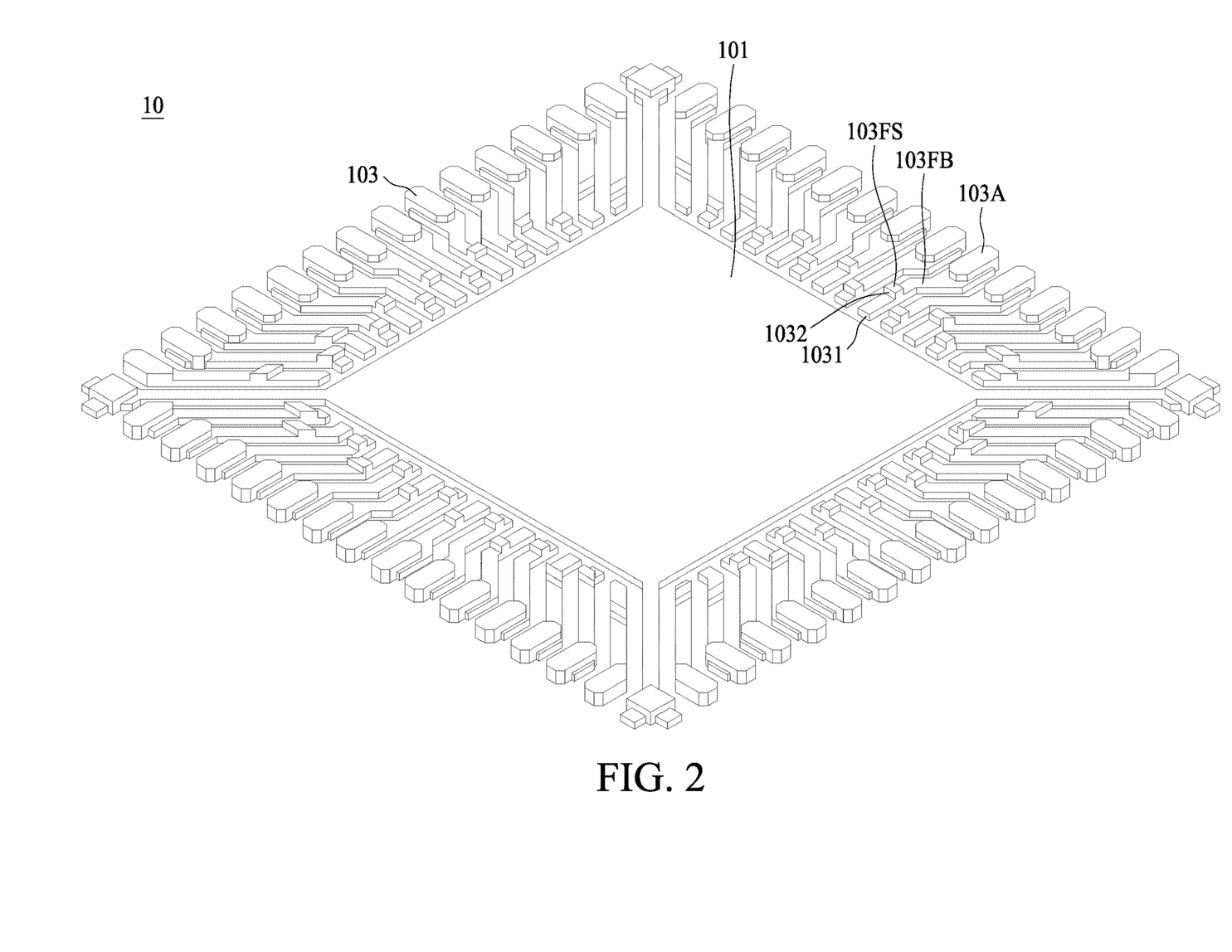
FIG. 2 illustrates a perspective view from a bottom side of the lead frame of FIG. 1.

FIG. 2 illustrates a perspective view from a bottom side of the lead frame 10 of FIG. 1. Elements with numerical labels identical to that in FIG. 1 are referred to same components and can be referred thereto. As can be seen from a bottom perspective view of FIG. 2, in addition to mutually isolated, the respective support structures 103FS on any of the adjacent leads 103 are disposed in a staggered fashion. For example, the support structure 103FS on a first lead is not laterally overlapping with the support structure 103FS on the second lead immediate adjacent to the first lead. The support structure 103FS on the first lead may be closer or further from the die paddle 101 than the support structure 103FS on the second lead immediate adjacent to the first lead.

Figure 3:
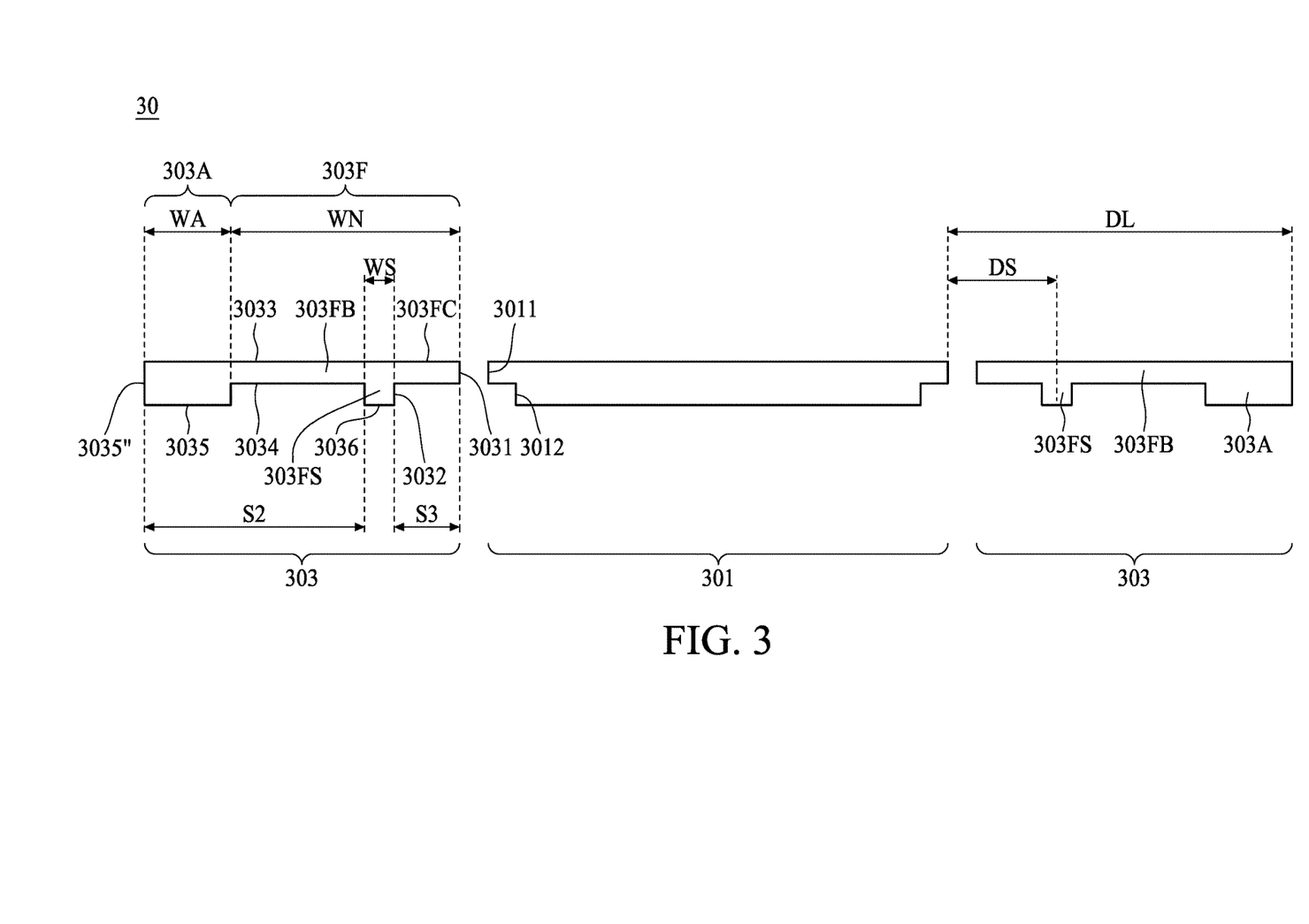
FIG. 3 illustrates a cross sectional view of a lead frame according to some embodiments of the present disclosure.

Referring to FIG. 3, FIG. 3 is a cross sectional view of a lead frame 30 according to some embodiments of the present disclosure. FIG. 3 may be dissected from line PP of FIG. 1 and hence showing a unit of a lead frame panel or a lead frame stripe. The lead frame 30 includes a die paddle 301 and a plurality of leads 303 surrounding the die paddle 301. As shown in FIG. 3, the die paddle 301 is surrounded by a left lead 303 and a right lead 303. Each of the leads 303 includes a finger portion 303F closer, or proximal, to the die paddle 301 and a lead portion 303A further, or distal, from the die paddle 301. In some embodiments, the lead 303 includes a lead end, or a side surface 3035" of the lead portion 303A facing away from the die paddle 301, and a terminal end, or a side surface 3031 of the finger portion 303F facing toward the die paddle 301. The lead end is opposite to the terminal end.

The support structure 303FS is disposed at a particular location of the main body 303FB of the finger portion 303F where a distance DS between the support structure 303FS and the die paddle 301 (e.g., the proximal edge of the die paddle) is smaller than a distance DL between the lead portion 303A and the die paddle 301 (e.g., the proximal edge of the die paddle). Alternatively, a distance S3 between the support structure 303FS and the terminal end (i.e., the side surface 3031 of the main body 303FB) is smaller than a distance S2 between the support structure 303FS and the lead end (i.e., the side surface 3035" of the lead portion 303A). With the disposal of the support structure 303FS at the aforesaid location, a long lead (e.g., a lead with a finger length WN greater than 2.0 mm) of the lead frame can be prevented from sagging at the terminal end while shorten the length of the bonding wire required to electrically connect a semiconductor die and the respective lead.

The finger portion 303F further includes a main body 303FB connected to the lead portion 303A at one end and facing toward the die paddle 301 at the opposite end. A side surface 3031 of the main body 303FB facing the die paddle 301 is spaced apart from a side surface 3011 of the die paddle 301. The main body 303FB of the finger portion 303F includes a top surface 3033, a bottom surface 3034, and the side surface 3031 connecting the top surface 3033 and the bottom surface 3034, constituting a substantially vertical boundary. The finger portion 303F further includes a support structure 303FS disposed at a location withdrawn from the end of the finger portion 303F facing the die paddle 301. The support structure 303FS may protrude from the bottom surface 3034 of the main body 303FB and having a side surface 3032 displaced away, or spaced apart, from the side surface 3031 of the main body 303FB. In some embodiments, more than one support structure 303FS may be disposed at the finger portion 303F, depending on various design needs. For example, if the finger length WN is long enough to accommodate more than one support structures 303FS, two or more support structures 303FS may be designed to support the finger portion 303F with a predetermined spacing between each of the support structures 303FS. Criteria of the predetermined spacing can be referred to FIG. 7C of the present disclosure.

Similar to the side surface 3031, the side surface 3032 of the support structure 303FS faces toward and spaced apart from a side surface 3012 of the die paddle 301. The side surface 3031 of the main body 303FB and the side surface 3032 of the support structure 303FS is connected by a portion of the bottom surface 3034 of the main body 303FB. The support structure 303FS further includes a bottom surface 3036 substantially leveled with a bottom surface 3035 of the lead portion 303A. In some embodiments, the side surface 3032 is withdrawn from the side surface 3031 by a predetermined distance S3 in prevention of under-etching of the portion of main body 303FB adjacent to the support structure 303FS during a half-etch and a full-etch operation, as will be discussed in FIG. 8C of the present disclosure. In some embodiments, when the finger length WN is greater than 2.0 mm, the predetermined distance S3 may be greater than about 400 μm. In some embodiments, the predetermined distance S3 may be greater than about 400 μm regardless of the finger length WN.

In some embodiments, the side surface 3012 is withdrawn from the side surface 3011 of the die paddle 301 to increase the adherence capability of the die paddle 301 and the encapsulant (not shown in FIG. 3) encapsulating the die paddle 301. However, the die paddle 301 described herein may include a vertical side surface connecting the top surface and the bottom surface without any withdrawn portion. A bonding section 303FC is defined between the side surface 3031 and the side surface 3032, configured to electrically connect a semiconductor die on the die paddle 301 and each of the plurality of leads by receiving a bonding wire.

A lateral projection of the side surface 3031 of the main body 303FB overlaps with the side surface 3011 and a portion of the lead portion 303A. In contrast, the lateral projection of the side surface 3031 is free from overlapping with the side surface 3032 of the support structure 303FS.

In some embodiments, a width WA of the lead portion 303A is substantially wider than a width WS of the support structure 303FS since the lead portion 303A is configured to expose from the encapsulant (not shown in FIG. 3) and bond with conductive pads or traces of the underlying carrier, for example, a printed circuit board (PCB). The conductive pads or traces of the PCB may be exposed from an opening of a solder resist layer, allowing electrical connection to be formed with the lead portion 303A. In contrast, conductive pads or traces of the PCB may be routed away from the vertical projection area of the support structure 303FS and a solder resist layer may cover the vertical projection area of the support structure 303FS.

Figure 4:
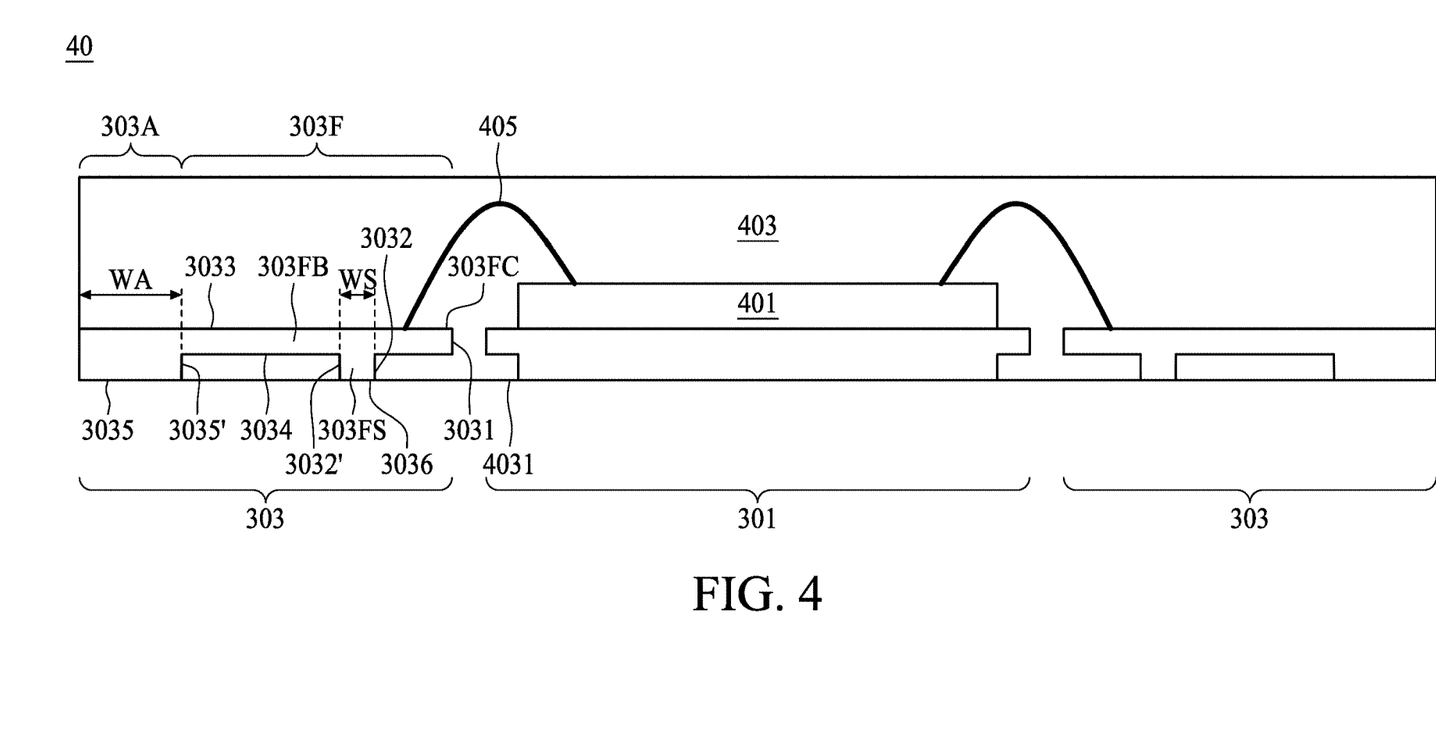
FIG. 4 illustrates a cross sectional view of a semiconductor package structure according to some embodiments of the present disclosure.

FIG. 4 is a cross sectional view of a semiconductor package structure 40 according to some embodiments of the present disclosure. The semiconductor package structure 40 is similar to the lead frame 30 of FIG. 3 except that an encapsulant 403 is formed to encapsulate the lead frame 30. The encapsulant 403 covers the die paddle 301 and each of the leads 303 at least from a top surface and a side surface. For example, the top surface 3033 of the main body 303FB of the finger portion 303F, the side surface 3031 of the main body 303FB, and the side surface 3032 of the support structure 303FS are in contact with the encapsulant 403. For example, the side surface 3032' of the support structure 303FS, the bottom surface 3034 of the main body 303FB, and the side surface 3035' of the lead portion 303A are in contact with the encapsulant 403, or alternatively speaking, the encapsulant 403 is enclosed by the space defined by the main body 303FB, the support structure 303FS, and the lead portion 303A.

The semiconductor package structure 40 further includes a semiconductor die 401 disposed on the die paddle 301. A bonding section 303FC on the main body 303FB is defined between the side surface 3031 and the side surface 3032, configured to electrically connect the semiconductor die 401 and each of the plurality of leads by receiving a bonding wire 405. As shown in FIG. 4, the bottom surface 3036 of the support structure 303FS and the bottom surface 3035 of the lead portion 303A are exposed from the encapsulant 403. The lead portion 303A is configured to expose from the encapsulant 403 and bond with conductive pads or traces of the underlying carrier, for example, a printed circuit board (PCB). The conductive pads or traces of the PCB may be exposed from an opening of a solder resist layer, allowing electrical connection to be formed with the lead portion 303A. In some embodiments, the bottom surface 3036 of the support structure 303FS and the bottom surface 3035 of the lead portion 303A are substantially coplanar with the bottom surface of the encapsulant 403. The support structure 303FS may provide extra contact area with the encapsulant 403 so as to increase the adhearability between encapsulant (e.g., molding compound) and the lead 303. Alternatively stated, the support structure 303FS serves as a mold lock in the present structure.

Figure 5:
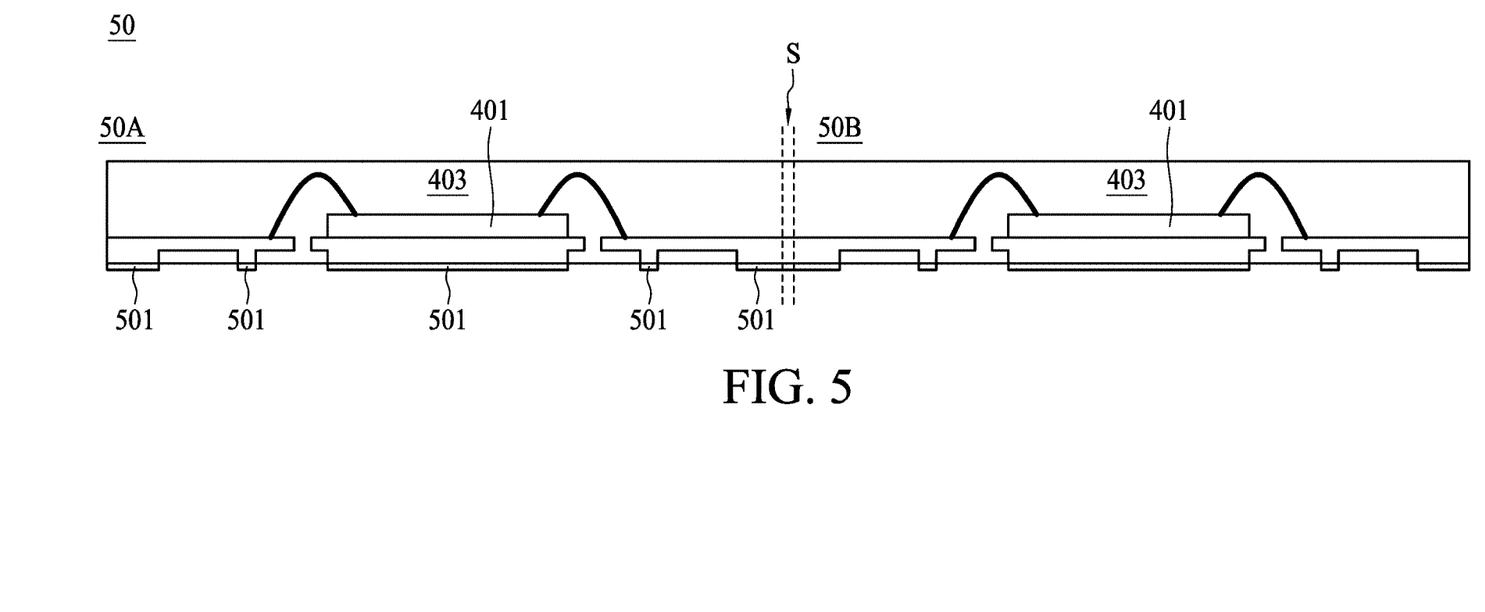
FIG. 5 illustrates a cross sectional view of a semiconductor package stripe according to some embodiments of the present disclosure.

FIG. 5 is a cross sectional view of a semiconductor package stripe 50 according to some embodiments of the present disclosure. The semiconductor package stripe 50 illustrated in FIG. 5 includes two semiconductor package structure 50A and 50B, which are to be separated along the singulation line S between adjacent lead frames packages. In addition, a tin layer 501 is in contact with the portions of the lead frame exposed from the encapsulant 403. For example, the tin layer 501 is in contact with the bottom surface of the die paddle 301, the bottom surface of the support structure 303FS, and the bottom surface of the lead portion 303A. In some embodiments, the tin layer 501 is formed by an electroplating operation after the encapsulation of the lead frame.

Figure 6:
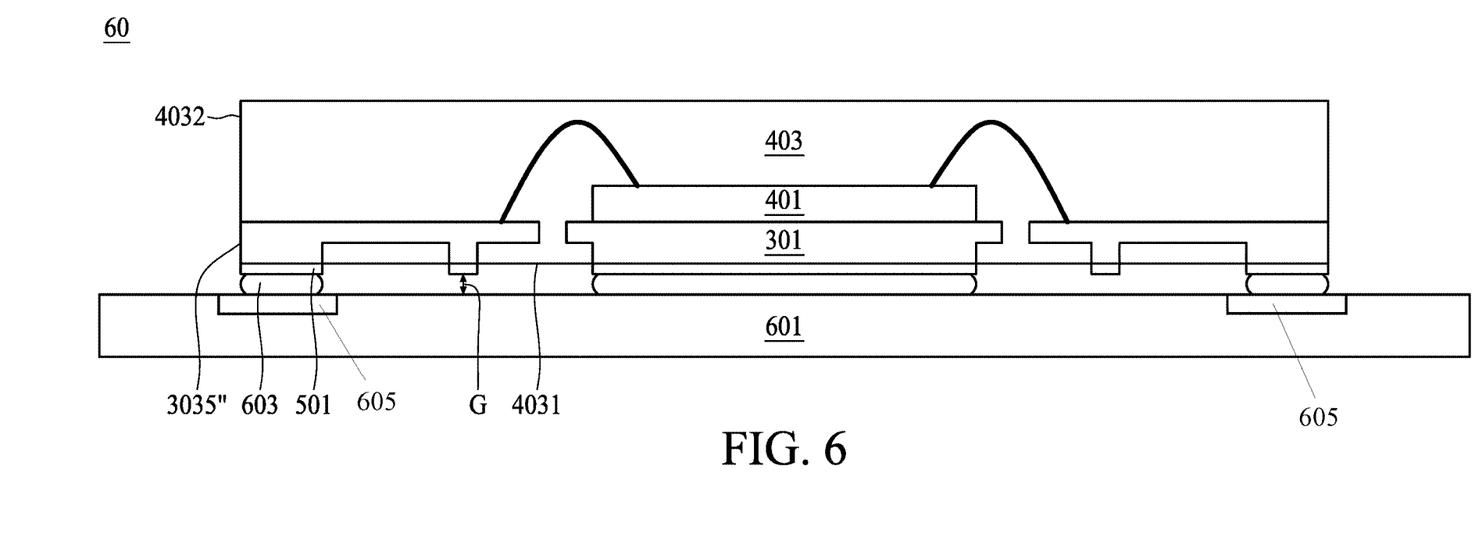
FIG. 6 illustrates a cross sectional view of a semiconductor package assembly according to some embodiments of the present disclosure.

FIG. 6 is a cross sectional view of a semiconductor package assembly 60 according to some embodiments of the present disclosure. The semiconductor package assembly 60 is similar to the semiconductor package structure 50A or 50B in FIG. 5 except that an additional substrate 601 is under the die paddle 301 and the plurality of leads 303. In contrast to the lead portion 303A where a conductive terminal 603 is disposed to connect the lead portion 303A and conducive pattern 605 (e.g., the conductive pads or traces) of the substrate 601, the support structure 303FS is a dummy structure with respect to the substrate 601 (e.g., a PCB).

In some embodiments, a gap G (e.g., an air gap) is between the support structure 303FS and the top surface of the substrate 601 to accommodate the conductive terminals 603, for example, a solder. The conductive terminal 603 and the bottom surface 4031 of the encapsulant 403 is exposed to the gap G. As illustrated in FIG. 6, the conductive pattern 605 of the PCB may be exposed from an opening of a solder resist layer, allowing electrical connection to be formed with the lead portion 303A through the conductive terminal 603. In contrast, conductive pads or traces of the PCB may be routed away from the vertical projection area of the support structure 303FS and a solder resist layer may cover the vertical projection area of the support structure 303FS. In addition, the lead end or the side surface 3035" of the lead portion 303A is exposed from a side surface 4032 of the encapsulant 403 as a result of a stripe or a panel singulation operation. In some embodiments, the support structure 303FS and the tin layer 501 exposed to the gap G may be an extra thermal dissipation channel to effectively dissipate the heat generated by the semiconductor die 401.

Figure 7A:
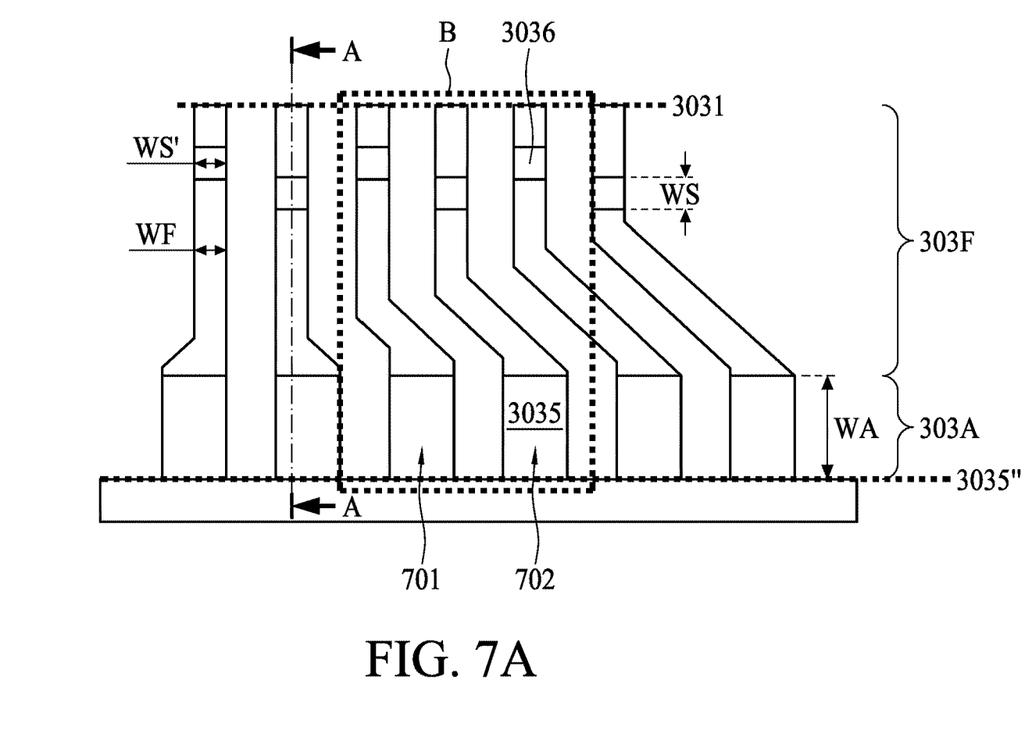
FIG. 7A illustrates a bottom view of a lead frame showing a lead portion and a support structure of the finger portion according to some embodiments of the present disclosure.
Figure 7B:
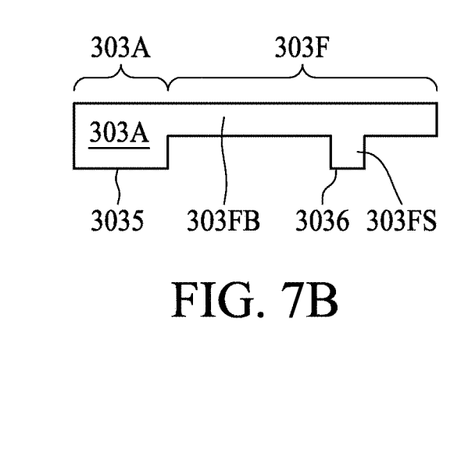
FIG. 7B illustrates a cross sectional view dissecting from line AA of FIG. 7A.

FIG. 7A is a bottom view of a lead frame showing a lead portion 303A and a support structure of the finger portion 303F according to some embodiments of the present disclosure. FIG. 7B is a cross sectional view dissecting from line AA of FIG. 7A. Referring to FIG. 7A and FIG. 7B, in some embodiments, the main body 303FB of the finger portion 303F of each of the leads has a traversing width WF, for example, about 90 μm, from a planar perspective. The support structure 303FS protruding from the bottom surface of the main body 303FB has a traversing width WS', for example, equal to or smaller than the traversing width WF of the main body 303FB, from a planar perspective. The traversing width WF of the support structure 303FS may be substantially identical to the traversing width WS' of the support structure 303FS. In some embodiments, the support structure 303FS may include a squared bottom surface, a rounded bottom surface, or a tetragonal bottom surface, depending on various design needs.

Each of the support structure 303FS includes a bottom surface 3036 substantially leveled with the bottom surface 3035 of the lead portion 303A. The respective support structure 303F in adjacent leads are mutually isolated, that is, the respective support structure 303F are discrete components without physical or electrical connection. The arrangement of the respective support structure 303F in each of the leads is designed to be disposed in a staggered fashion. For example, the support structure 303FS of the first lead 701 is spaced from the terminal end 3031 by a first distance, and the support structure 303FS of the second lead 702 adjacent to the first lead 701 is spaced from the terminal end 331 by a second distance. The first distance is different from the second distance. When the respective support structure 303FS on adjacent leads follows the afore-described arrangement, all the respective support structure 303FS may be disposed in a stagger manner.

Figure 7C:
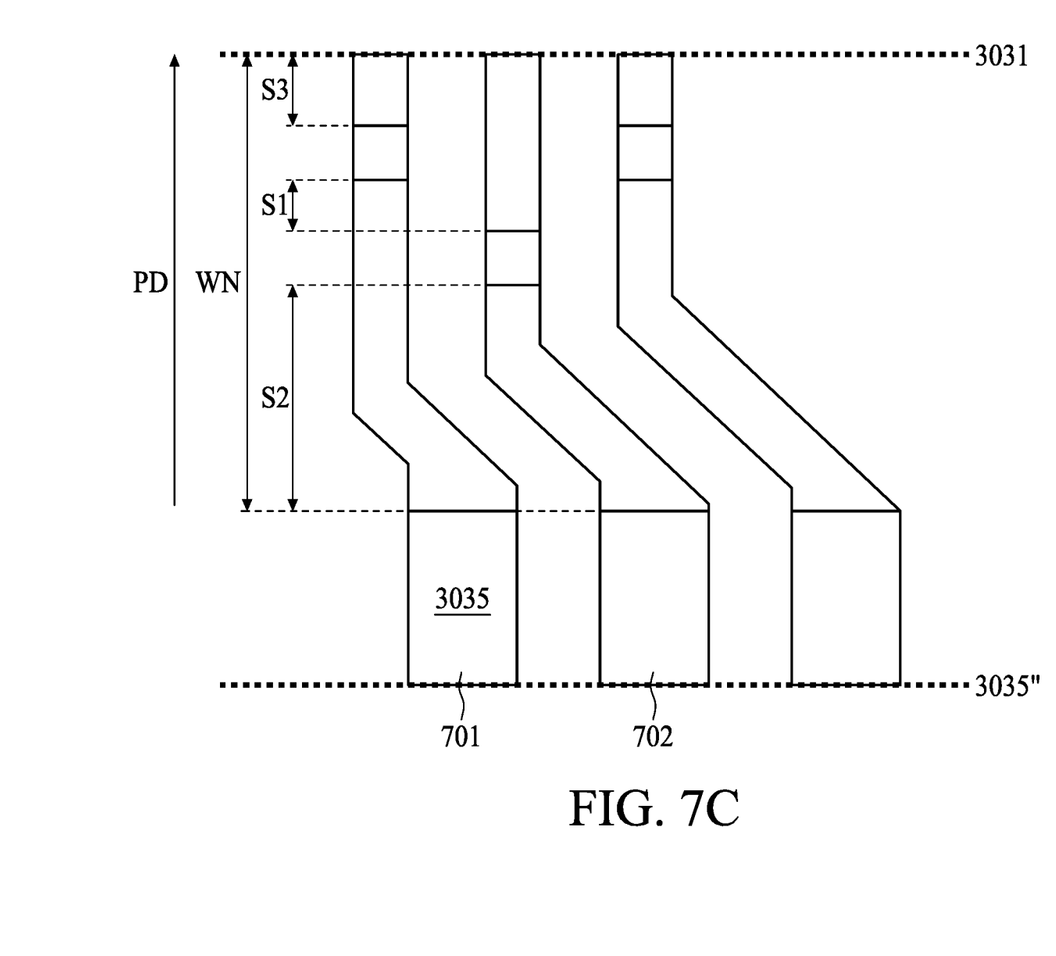
FIG. 7C illustrates an enlarged view of a region B of FIG. 7A.

Referring to FIG. 7C, FIG. 7C is an enlarged view of a region B of FIG. 7A. In some embodiments, the support structure 303FS on the first lead 701 follows a design rule to space apart from the support structure 303FS on the second lead 702, or the adjacent lead, by a distance S1, for example, at least 200 μm. The distance S1 is measured along a primary direction PD along the finger portion 303F of each of the leads 303. In some embodiments, the support structure 303FS on any of the first lead 701 and second lead 702 follows a design rule to space apart from the lead portion 303A by a distance S2, for example, at least 200 μm. The distance S2 is measured along a primary direction PD along the finger portion 303F of each of the leads 303. The distance S1 and distance S2 are so designed to prevent under-etching of the portion of main body 303FB adjacent to the support structure 303FS, as well as to prevent tin bridging between adjacent support structure 303FS and/or lead portion 303A after the encapsulant is formed to cover the leads 303 and the die paddle 301.

In some embodiments, the support structure 303FS is withdrawn from the terminal end 3031 by a predetermined distance S3 in prevention of under-etching of the portion of main body 303FB adjacent to the support structure 303FS during a half-etch and a full-etch operation, as will be discussed in FIG. 8C of the present disclosure. In some embodiments, when the finger length WN is greater than 2.0 mm, the predetermined distance S3 may be greater than about 400 μm. In some embodiments, the predetermined distance S3 may be greater than about 400 μm regardless of the finger length WN.

Figure 7D:
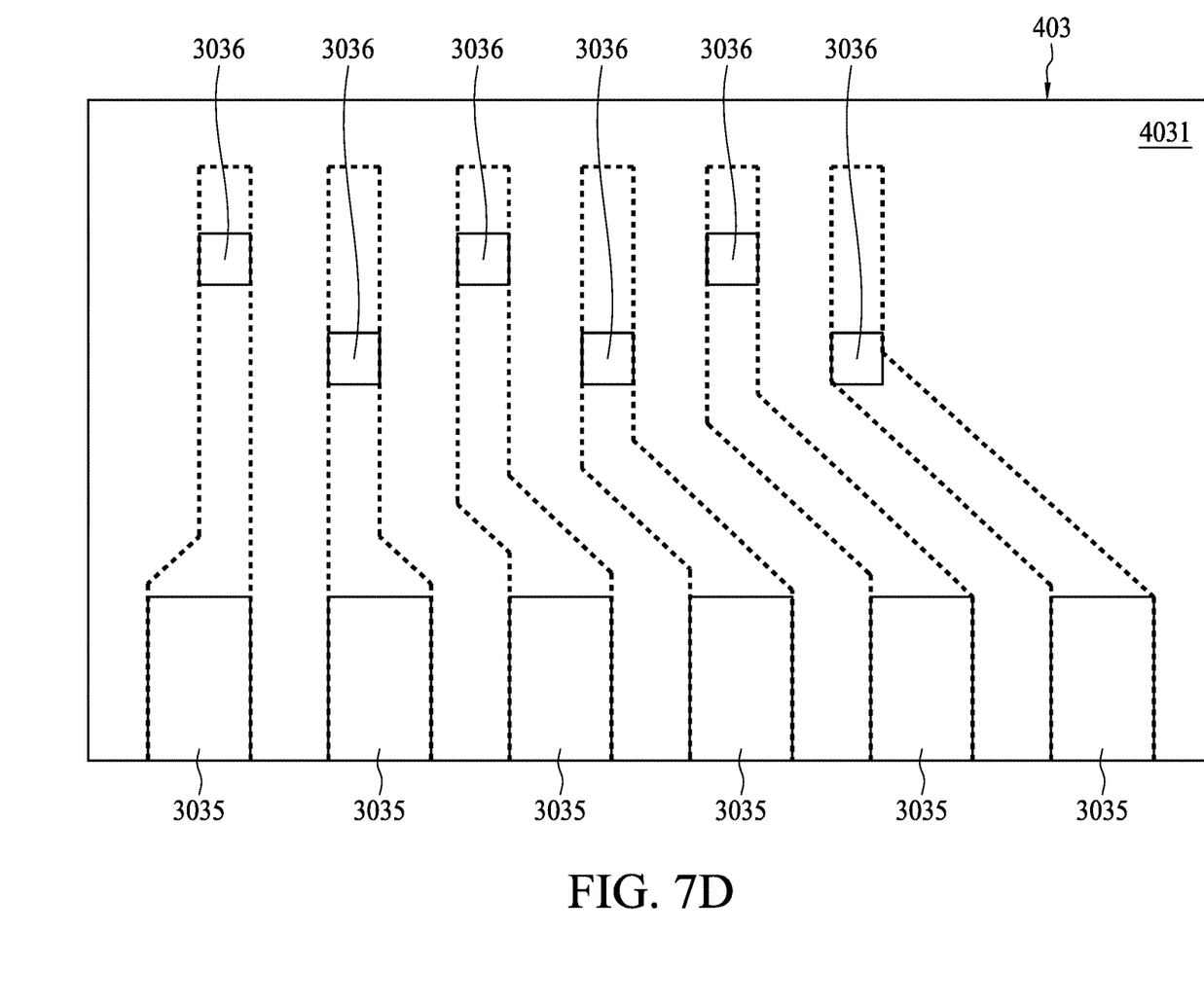
FIG. 7D illustrates a bottom view of a semiconductor package structure including the lead frame of FIG. 7A according to some embodiments of the present disclosure.

FIG. 7D is a bottom view of a semiconductor package structure including the lead frame of FIG. 7A according to some embodiments of the present disclosure. From a bottom planar perspective, the semiconductor package structure of FIG. 7D shows a bottom surface 4031 of the encapsulant 403. The bottom surfaces 3036 of the support structure 303FS are exposed from the bottom surface 4031 of the encapsulant 403. Similarly, the bottom surfaces 3035 of the lead portion 303A are exposed from the bottom surface 4031 of the encapsulant 403. The exposed bottom surfaces 3036 of the support structure 303FS may serve the purpose of positioning particular locations of the lead frame after the encapsulation operation. For example, by inspecting the exposed bottom surfaces 3036 of the support structure 303FS, the terminal end of each lead can be positioned. The main body 303FB of the respective finger portion 303F is embedded under the encapsulant 403 therefore is delineated by dotted lines. The exposed bottom surfaces 3035 and 3036 are to be deposited with a conductive layer, e.g., a tin layer, so as to prepare for the subsequent boarding operation.

Figure 8A:
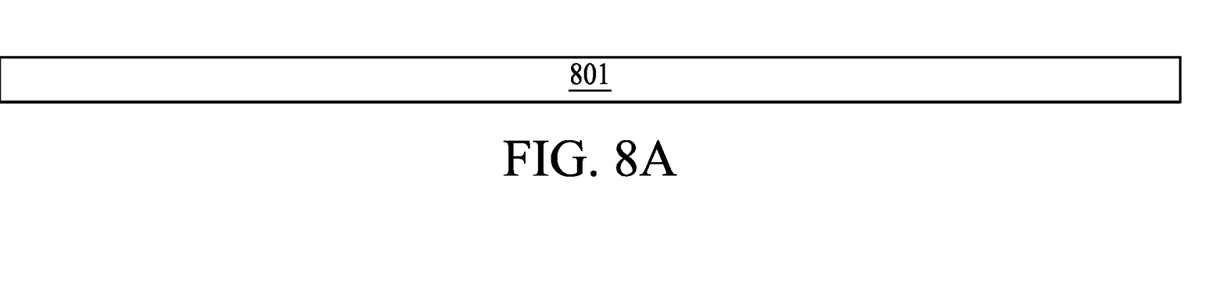
FIG. 8A to FIG. 8F illustrate cross sectional views during various manufacturing operations of a semiconductor package structure according to some embodiments of the present disclosure.
Figure 8B:
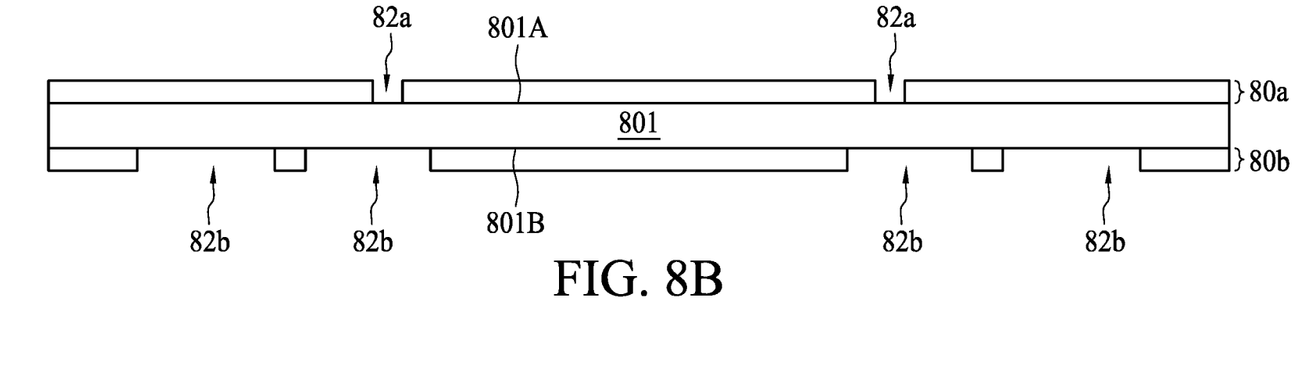
Figure 8C:
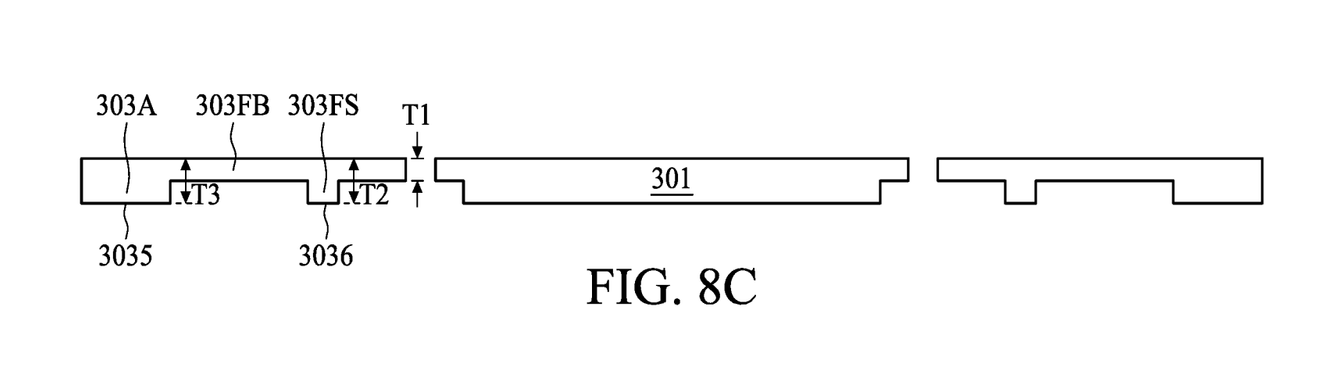

FIG. 8A to FIG. 8F are cross sectional views during various manufacturing operations of a semiconductor package structure according to some embodiments of the present disclosure. In FIG. 8A, a metal plate 801 is provided. In some embodiments, the metal plate 801 may be a copper plate. In FIG. 8B and FIG. 8C, the metal plate 801 is etched to form a lead frame. The metal plate 801 includes a top surface 801A and a bottom surface 801B. A masking layer 80a having a first pattern is formed over the top surface 801A of the metal plate 801. The first pattern may include a plurality of openings 82a exposing the top surface 801A of the metal plate 801 at predetermined locations. Similarly, a masking layer 80b having a second pattern is formed over the bottom surface 801B of the metal plate 801. The second pattern may include a plurality of openings 82b exposing the bottom surface 801B of the metal plate 801 at predetermined locations. An etching operation is performed from both surfaces 801A and 801B of the metal plate 801, for example, a full etch takes place at the locations where opening 82a overlaps with the opening 82b, a half etch takes place at the locations where only one of the openings 82a, 82b is present, and no etch takes place at the locations where both surfaces 801A, 801B are covered with the masking layers 80a, 80b.

In FIG. 8C, after the completion of the etching operation, the lead portion 303A, the main body 303FB, and the support structure 303FS are formed. A full etch takes place between the die paddle 301 and the lead 303 so that the lead 303 and the die paddle 301 are disconnected from the cross sectional perspective. A thickness T2 of the support structure 303FS is substantially identical to a thickness T3 of the lead portion 303A. A thickness T1 of the main body 303FB is thinner than the thickness T2 or the thickness T3. In some embodiments, the bottom surface 3035 of the lead portion 303A is substantially leveled with the bottom surface 3036 of the support structure 303FS.

Figure 8D:
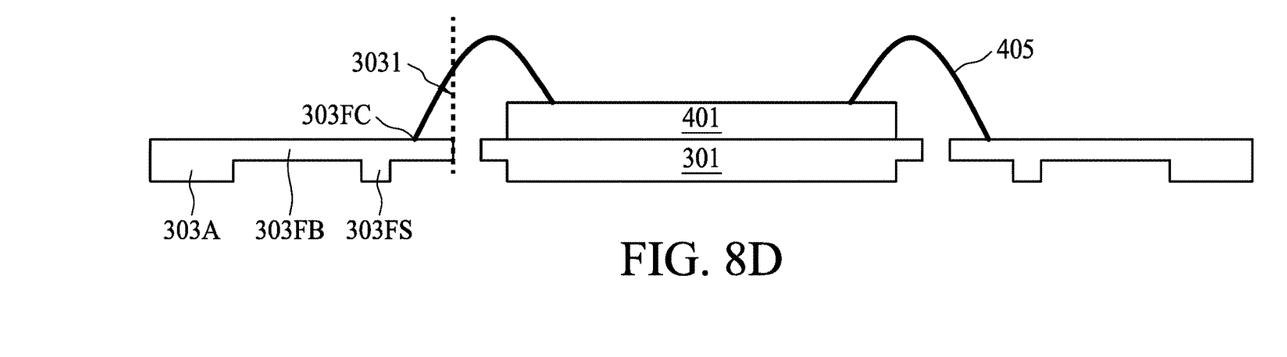

In FIG. 8D, a semiconductor die 401 is disposed on the die paddle 301, and a bonding wire 405 is formed to connect the I/O on the semiconductor die 401 and the respective main body 303FB of the lead. In some embodiments, the bonding wire 405 is connected to a bonding section 303FC of the main body 303FB. In some embodiments, a bonding kit can be omitted from supporting the terminal end of the lead because the support structure 303FS may serve the purpose of providing mechanical support when the wedge bond imposed on the bonding section 303FC of the main body 303FB.

Figures 8E, 8F:
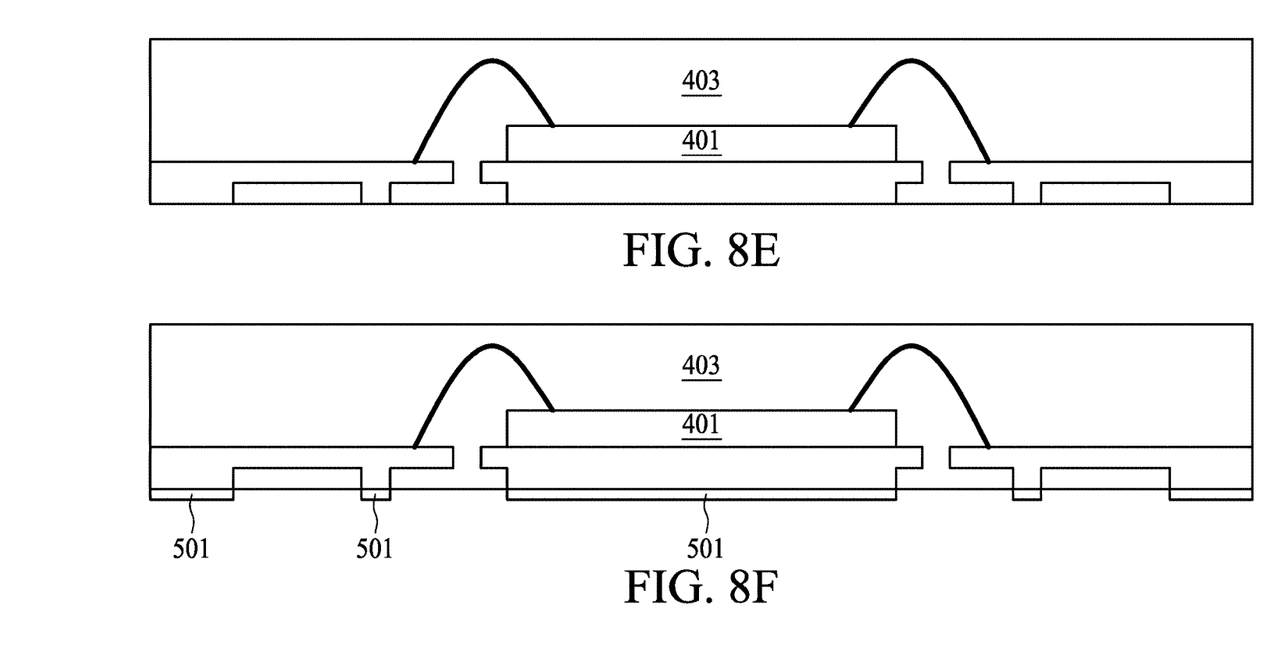

In FIG. 8E, the intermediate semiconductor package structure of FIG. 8D is encapsulated by an encapsulant 403, for example, molding compound, or molding compound with thermal conductive fillers. Bottom surface 3036 of the support structure 303FS and the bottom surface 3035 of the lead portion 303A are exposed from the encapsulant 403. In FIG. 8F, the exposed bottom surfaces 3035 and 3036 are deposited with a conductive layer 501, e.g., a tin layer, so as to prepare for the subsequent boarding operations. The formation of the conductive layer 501 may include an electroplating operation.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package assembly, comprising:
    a die paddle;
    a plurality of leads surrounding the die paddle, each of the leads including a finger portion proximal to the die paddle and a lead portion distal from the die paddle, the finger portion comprising a main body and at least one support structure; and
    a substrate under the die paddle and the plurality of leads, the support structure being a dummy structure with respect to the substrate, wherein a gap is between a bottom of the support structure and a top surface of the substrate,
    wherein the respective support structures on adjacent leads are mutually isolated, and a distance between the support structure and the die paddle is smaller than a distance between the lead portion and the die paddle.

2. The semiconductor package assembly of claim 1, wherein the lead portion is bonded to the substrate via a solder.

3. The semiconductor package assembly of claim 1, wherein a solder resist of the substrate is under a projection of the support structure.

4. The semiconductor package assembly of claim 1, further comprising an encapsulant covering the die paddle and the leads, wherein a bottom surface of the encapsulant is exposed to the gap.

5. The semiconductor package assembly of claim 4, wherein a side surface of the lead portion facing away from the die paddle is exposed from a side surface of the encapsulant.

* * * * *